(12) United States Patent
Tsou et al.

(10) Patent No.: US 6,847,076 B1
(45) Date of Patent: Jan. 25, 2005

(54) ENHANCED RETENTION TIME FOR EMBEDDED DYNAMIC RANDOM ACCESS MEMORY (DRAM)

(75) Inventors: George T. C. Tsou, Hsin-Chu (TW); Kevin W. C. Chiang, Hsin-Chu (TW); Ted T. C. Kao, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/677,156

(22) Filed: Oct. 1, 2003

(51) Int. Cl.[7] .................. H01L 27/108; H01L 29/76; H01L 29/94; H01L 31/119
(52) U.S. Cl. .................. 257/296; 257/313; 257/297
(58) Field of Search ................ 257/296–313; 438/238, 239

(56) References Cited

U.S. PATENT DOCUMENTS

| | | | | |
|---|---|---|---|---|
| 5,023,750 A | * | 6/1991 | Hirayama | 361/313 |
| 5,033,022 A | * | 7/1991 | Segawa | 365/63 |
| 6,785,157 B2 | * | 8/2004 | Arimoto et al. | 365/149 |

* cited by examiner

Primary Examiner—Thien F Tran
(74) Attorney, Agent, or Firm—Tung & Associates

(57) ABSTRACT

Increasing the retention time of an embedded dynamic random access memory (DRAM) is disclosed. An embedded DRAM includes a metal oxide semiconductor (MOS) capacitor. The capacitor has a storage node formed between a P+ doped region and a polysilicon plate within an N well. An N– doped region is situated substantially completely under the polysilicon plate and substantially under the P+ doped region. The presence of the N– doped region decreases the threshold voltage of the capacitor and reduces effectively the junction leakage current to the N well, achieving a larger retention time.

21 Claims, 3 Drawing Sheets

ENHANCED RETENTION TIME FOR EMBEDDED DYNAMIC RANDOM ACCESS MEMORY (DRAM)

FIELD OF THE INVENTION

This invention relates generally to embedded dynamic random access memories (DRAM's), and more particularly to the retention time of the storage of logical values within such DRAM's.

BACKGROUND OF THE INVENTION

A dynamic random access memory (DRAM) is usually able to store two different values, logical zero and logical one. The memory is volatile, in that once power is removed from the memory, it loses its stored value. The memory must be periodically refreshed in order it to maintain the value stored. The period of time that can elapse before the memory must be refreshed is known as the retention time of the memory, which is the length of time that the memory can retain its stored logical value.

FIG. 1 shows an embedded DRAM 100 having a transfer gate transistor and a P-channel charge storage capacitor. The embedded DRAM 100 includes a metal oxide semiconductor (MOS) capacitor that includes a polysilicon plate 114, and a storage node 108 formed with a P+ implant 106. A voltage Vbb 122, such as −0.3 volts (V), is biased at the poly plate 114 to have the storage node 108 operate in the inversion region to maintain a capacitance. Unfortunately, this shallow bias is close enough to the threshold voltage Vt of the MOS capacitor, and might bias the capacitor in the depletion region and turn off the channel between the storage node 108 and the capacitor, causing incomplete data writing. This causes poor retention time of the logically stored value in the capacitor, especially for the writing and storage of a logical value zero.

The embedded DRAM 100 also includes an N well 102, in which there are P+ implants 104 and 112. A bit line 118 is connected to the bit line contact P+ implant 104. A transfer gate 116 is connected to a voltage Vbb/Vpp 120, where Vbb is the turn-on voltage for the DRAM 100, and Vpp is the turn-off voltage. The N well 102 is biased at the voltage Vdd 124. There is a region of shallow trench isolation (STI) 110 underneath the poly plate 114. A threshold current Ith 126 flows from the P+ implant 106 to the P+ implant 104. A junction leakage current Ij 128 flows down from the P+ implant 106 to the N well 102. A gate current 130 and a gate current 132 flow from the P+ implant 106 to the poly plate 114 and the transfer gate 116, respectively.

The poor retention time of the logically stored value in the capacitor can be considered as being related to how large the junction leakage current Ij 128 is. The junction current Ij 128 is in turn related to the doping profile and the junction bias. The NVY (P-type) implant proposed in this invention counteract the N-Well dosage, effectively reducing the threshold voltage and increase the charges of writing into capacitor. The P-implant also degrades the gradient of doping profile between the storage node and NW that can effectively decrease the junction leakage. So the retention time of memory can be improved.

FIG. 2 shows the equivalent circuit observed from the storage node 108. The memory 100 includes the storage node 108, the voltage Vbb 122, the MOS capacitor 204, and the resistance 202. The resistor 202 accounts for the channel resistance of the capacitor of FIG. 1 and the capacitor 204 having the STI 110 of FIG. 1 and the poly plate 114 of FIG. 1. Thus, desirably decreasing the resistance 202 by decreasing the Vt of the capacitor and increasing the current to the capacitor 204 allows for enhanced retention time of the MOS capacitor.

FIGS. 3 and 4 show prior art approaches for accomplishing this within the memory 100. In FIG. 3, a P− depletion layer 302 is formed under the poly plate 114 of the capacitor. This layer has better capability for data writing, but increases the junction leak current Ij 128 of FIG. 1 at the same time due to a larger p-n junction area having been formed. In FIG. 4, pocket P− implants 402 and 404 are added around the P+ implants 104 and 106, respectively, accomplishing the same objective. However, this approach does not work for small devices, less than 0.1 micron in feature size, since it would increase inevitably the source-drain punch-through possibility, and thus is not desirable.

Therefore, there is a need to increase the retention time of the MOS capacitor of an embedded DRAM. Such an increase should be accomplished without P− implants as is done in the memory 100 of FIG. 3, which can cause larger junction leakage. Such an extra should also be accomplished without pocket P− implants as is done in the memory 100 of FIG. 4, which increases the possibility of punch-through for small devices. For these and other reasons, there is a need for the present invention.

SUMMARY OF THE INVENTION

The invention relates to increasing the retention time of an embedded dynamic random access memory (DRAM). An embedded DRAM of the invention includes a metal oxide semiconductor (MOS) capacitor. The capacitor has a storage node formed between a P+ doped region and a polysilicon plate, within an N well. An N− doped region is situated substantially completely under the polysilicon plate and substantially under the P+ doped region. The presence of the N− doped region decreases the threshold voltage of the capacitor and reduces effectively the junction leakage current to the N well, achieving a larger retention time.

Embodiments of the invention provide for advantages over the prior art. The retention time for storing a logical zero value is particularly increased, preferably without increasing the junction leakage current, as in the embedded DRAM of FIG. 3, and which can be utilized with small feature size devices, as compared to the embedded DRAM of FIG. 4. The bias margin for the capacitor is also increased. The bias for the polysilicon plate of the capacitor can be reduced, in accordance with reduction of the capacitor threshold voltage. Thus, a thinner gate oxide can be used to sustain the same electric field, increasing capacitance. Still other aspects, embodiments, and advantages of the invention will become apparent by reading the detailed description that follows, and by referencing the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 5:
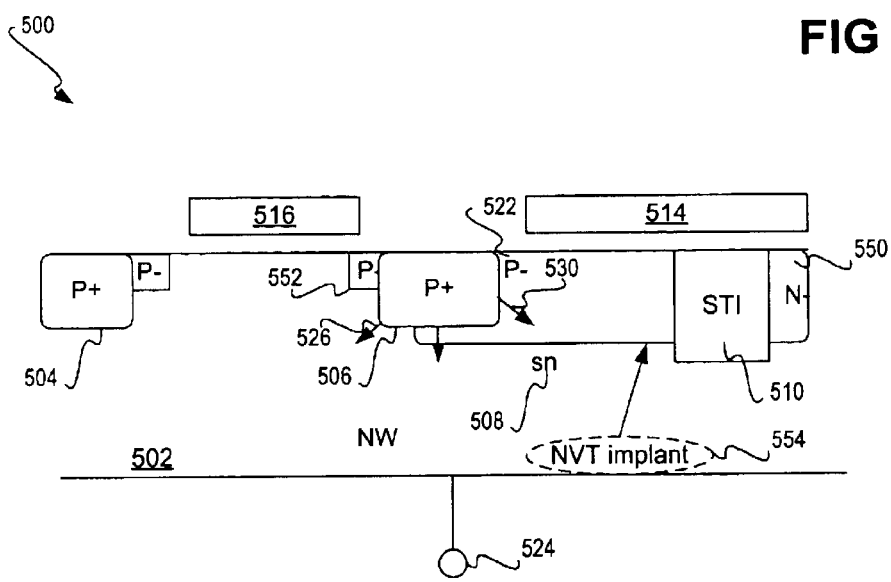
FIG. 5 is a diagram of a DRAM that includes a MOS capacitor that has better retention time to form an P– layer by lightly doping with P-type at a low dosage, according to an embodiment of the invention. The P-type implant can be fabricated utilizing a mask already used for fabricating the embedded DRAM, and also can be used in small devices.

FIG. 5 shows a dynamic random access memory (DRAM) 500, according to an embodiment of the invention. The DRAM 500 of FIG. 5 is consistent with the DRAM 100 of FIG. 1, and features shown in FIG. 1 that are not shown in FIG. 5 may nevertheless be implemented in the DRAM 500. Likewise, the DRAM of FIG. 5 can be modeled as the DRAM 100 of FIG. 2. The DRAM 500 particularly increases the retention time of the storage node 508. This is accomplished by decreasing the threshold voltage of the capacitor of the DRAM 500, reducing effectively the junction leakage current to an N well of the DRAM 500.

The storage node 508 is part of a metal oxide semiconductor (MOS) capacitor formed between the P+ doped region 506 and the polysilicon plate 514, with a region of shallow trench isolation (STI) 510 underneath the polysilicon plate 514, within the N well 502. There is also the P+ doped region 504, and the N well 502 is biased negative via the voltage Vdd 524.

An N– doped region 550 lies within the N well 502, preferably completely under the polysilicon plate 514, and substantially under the P+ doped region 506. That is, the N– doped region 550 does not extend completely under the P+ doped region 506. In other words, the N-doped region 550 extends only over part of the storage node 508, such as half thereof. There is also a P– doped region 552 as indicated in FIG. 5. The N– doped region 550 results from an NVt implant 554, as can be appreciated by those of ordinary skill within the art.

The junction leakage current 528 is effectively decreased due to the degraded gradient of doping profile of the junction between 506 and 522. The MOS capacitor has a threshold voltage that is also decreased due to the N– doped region 550. By decreasing the threshold voltage, the N– doped region 550 decreases the resistance 202 of FIG. 2, which increases the retention time. That is, a more complete data write occurs, increasing retention time.

Figure 1:
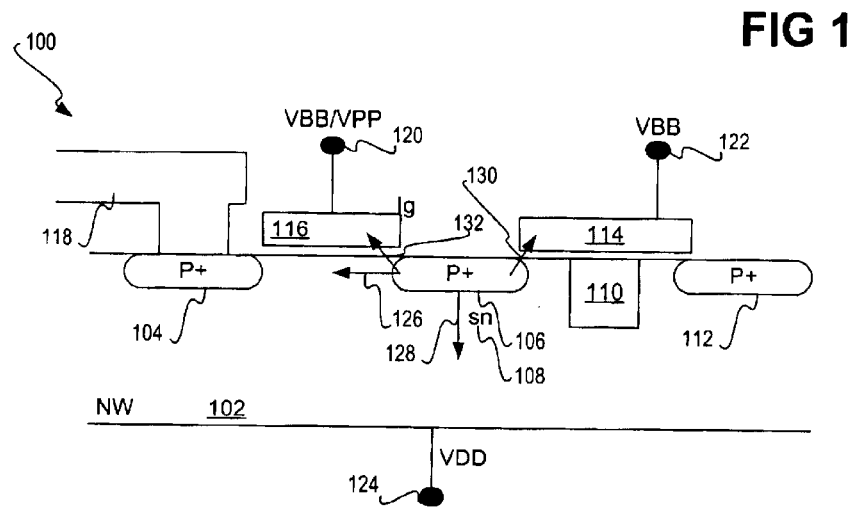
FIG. 1 is a diagram of a dynamic random access memory (RAM) that includes a metal oxide semiconductor (MOS) capacitor.
Figure 2:
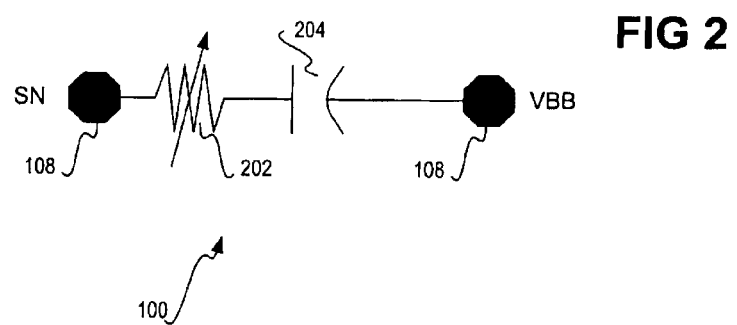
FIG. 2 is a diagram of an equivalent circuit observed electrically from the storage node of FIG. 1.
Figure 3:
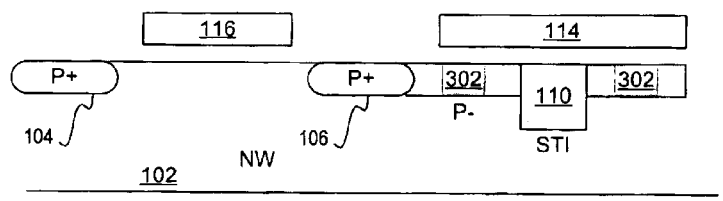
FIG. 3 is a diagram of a DRAM that includes a MOS capacitor that has an added P– layer to form the bottom plate of the capacitor.
Figure 4:
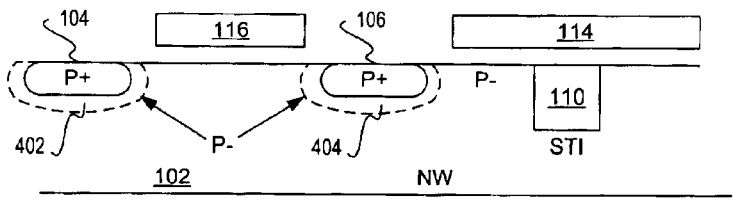
FIG. 4 is a diagram of an embedded DRAM that includes a MOS capacitor that has better retention time due to added P– pocket implants, according to the prior art, but which is also otherwise disadvantageous.

The N– doped region 550 can in one embodiment of the invention be fabricated at least in part by using an existing semiconductor mask used for fabricating the DRAM 100, such that no specialized mask is needed for the implantation. Thus, a method of an embodiment of the invention for fabricating the DRAM 100 includes at least fabrication of the MOS capacitor as shown in FIG. 1, and then implanting the N– doped region 550 as shown in FIG. 5.

Thus, to take advantage of the MOS capacitor of FIG. 5, the bottom plate of the capacitor is kept as an inversion layer, as the storage node 508. A negative bias is thus used for the poly (top) plate 514 to keep the capacitor operating in the inversion region. However, the negative bias cannot be too deep. A deep top plate bias would mean a higher electrical field crossing the gate oxide of the storage cell, which would increase the gate direct tunneling current. Therefore, a shallow Vbb voltage is used at the poly plate 514, which is shown in FIG. 1 as the Vbb voltage 122.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. An embedded dynamic random access memory (DRAM) comprising:
   a metal oxide semiconductor (MOS) capacitor having a storage node formed between a P+ doped region and a polysilicon plate; and,
   an N– doped region by adding an extra P-type implantation which is substantially completely under the polysilicon plate and substantially under the P+ doped region, to decrease a threshold voltage of the capacitor and degrading the gradient of the PN junction doping profile between storage node and N-Well.

2. The embedded DRAM of claim 1, wherein the MOS capacitor has a junction leakage current that is decreased due to the degraded PN junction doping profile resulted from the N– doped region.

3. The embedded DRAM of claim 1, wherein the N-doped region is formed by adding extra P-type dosages in N-Well region beneath the MOS capacitor or just using native N-Well implant without any Vt adjustment, pocket or channel implant.

4. The embedded DRAM of claim 1, wherein the MOS capacitor has a threshold voltage that is decreased due to the N– doped region.

5. The embedded DRAM of claim 1, wherein the N– doped region is fabricated at least in part by using an existing semiconductor mask.

6. The embedded DRAM of claim 1, further comprising an N well in which the P+ doped region and the N– doped region are situated, the polysilicon plate situated over the N well.

7. The embedded DRAM of claim 6, wherein the N well is biased negative at a voltage Vdd.

8. The embedded DRAM of claim 1, further comprising a second P+ doped region.

9. The embedded DRAM of claim 8, further comprising a transfer gate over and between the P+ doped region and the second P+ doped region.

10. The embedded DRAM of claim 9, wherein the transfer gate has applied thereto a Vbb turn-on voltage to turn on the embedded DRAM and a Vpp turn-off voltage to turn off the embedded DRAM.

11. An embedded dynamic random access memory (DRAM) comprising:
    an N well biased at a negative voltage;
    a metal oxide semiconductor (MOS) capacitor having a storage node formed between a P+ doped region in the N well and a polysilicon plate over the N well; and,
    a N− doped region in the N well substantially completely under the polysilicon plate and substantially under the P+ doped region, to increase a retention time of the storage node of the capacitor.

12. The embedded DRAM of claim 11, wherein the MOS capacitor has a junction leakage current that is decreased due to the N− doped region.

13. The embedded DRAM of claim 11, wherein the MOS capacitor has a threshold voltage that is decreased due to the N− doped region.

14. The embedded DRAM of claim 11, wherein the N− doped region is fabricated at least in part by using an existing semiconductor mask.

15. The embedded DRAM of claim 11, further comprising a second P+ doped region in the N well.

16. The embedded DRAM of claim 15, further comprising a transfer gate over and between the P+ doped region and the second P+ doped region.

17. The embedded DRAM of claim 16, wherein the transfer gate has applied thereto a Vbb turn-on voltage to turn on the embedded DRAM and a Vpp turn-off voltage to turn off the embedded DRAM.

18. A method comprising:
    fabricating a metal oxide semiconductor (MOS) capacitor of an embedded dynamic random access memory (DRAM) having a storage node formed between a P+ doped region and a polysilicon plate; and,
    N− doping a region substantially completely under the polysilicon plate and substantially under the P+ doped region, to increase a retention time of the storage node of the capacitor.

19. The method of claim 18, wherein the MOS capacitor has a junction leakage current that is decreased due to the N− doped region.

20. The method of claim 18, wherein the MOS capacitor has a threshold voltage that is decreased due to the N− doped region.

21. The method of claim 18, wherein the N− doped region is fabricated at least in part by using a semiconductor mask used in fabricating the MOS capacitor.

* * * * *